US012562466B2

(12) United States Patent (10) Patent No.: US 12,562,466 B2
Ahn et al. (45) Date of Patent: Feb. 24, 2026

(54) HIDDEN ANTENNA MODULE

(71) Applicants:HYUNDAI MOBIS CO., LTD., Seoul (KR); WINNERCOM CO., LTD., Gimhae-si (KR)

(72) Inventors: Jung Sun Ahn, Yongin-si (KR); Byeong Jun Kang, Yongin-si (KR); Tae Hyoung Kim, Yongin-si (KR)

(73) Assignees: HYUNDAI MOBIS CO., LTD., Seoul (KR); WINNERCOM CO., LTD., Gimhae-si (KR)

( * ) Notice: Subject to any disclaimer, the term of this patent is extended or adjusted under 35 U.S.C. 154(b) by 64 days.

(21) Appl. No.: 18/585,218

(22) Filed: Feb. 23, 2024

(65) Prior Publication Data

US 2024/0421468 A1 Dec. 19, 2024

(30) Foreign Application Priority Data

Jun. 13, 2023 (KR) ........................ 10-2023-0075630

(51) Int. Cl.
H01Q 1/32 (2006.01)
H01Q 1/52 (2006.01)
H05K 7/14 (2006.01)
(52) U.S. Cl.
CPC ............. H01Q 1/3275 (2013.01); H01Q 1/52 (2013.01); H05K 7/1427 (2013.01)
(58) Field of Classification Search
CPC ...... H01Q 1/32; H01Q 1/3275; H01Q 1/3291; H01Q 1/40; H01Q 1/405; H01Q 1/42; H01Q 1/526
See application file for complete search history.

(56) References Cited

U.S. PATENT DOCUMENTS

| | | | |
|---|---|---|---|
| 8,026,864 B2 * | 9/2011 | Noro ........................ | H01Q 1/38 343/846 |
| 2009/0066593 A1 * | 3/2009 | Jared .................... | H01Q 1/1214 343/713 |
| 2010/0117912 A1 * | 5/2010 | Noro .................... | H01Q 1/1214 343/878 |

(Continued)

FOREIGN PATENT DOCUMENTS

| | | | | |
|---|---|---|---|---|
| DE | 102020206164 B3 | 9/2021 | | |
| KR | 20220103519 A | 7/2022 | | |
| WO | WO-2021228332 A1 * | 11/2021 | ........... | H01Q 1/1271 |

OTHER PUBLICATIONS

European search report issued on Sep. 13, 2024 in corresponding European Application No. 24159819.2.

*Primary Examiner* — Jason M Crawford
(74) *Attorney, Agent, or Firm* — NovoTechIP International PLLC

(57) ABSTRACT

Provided is a hidden antenna module a housing including upper and lower covers, a first substrate provided inside the housing, second and third substrates provided inside the housing and respectively provided on both sides of the first substrate, upper and lower shield cans provided inside the housing and respectively provided on one side and the other side of at least one of the first to third substrates to support a portion of at least one of the first to third substrates, and a connection member connecting the first to third substrates to each other, wherein the first to third substrates are connected at different angles by the connection member.

8 Claims, 17 Drawing Sheets

(56) References Cited

U.S. PATENT DOCUMENTS

| | | | | |
|---|---|---|---|---|
| 2018/0115051 A1* | 4/2018 | Nguyen | ............... | H05K 9/0026 |
| 2019/0312342 A1* | 10/2019 | Sautter | ................ | H01Q 1/3275 |
| 2020/0243940 A1* | 7/2020 | Greenstein | ............... | H01Q 1/42 |
| 2021/0286047 A1* | 9/2021 | Schulte | ................... | G01S 7/028 |
| 2021/0293919 A1* | 9/2021 | Schulte | ................... | H01Q 1/42 |
| 2022/0149512 A1* | 5/2022 | Tsuchida | ................. | H01Q 1/50 |
| 2022/0201834 A1* | 6/2022 | Koike | ................. | H01Q 1/3275 |
| 2022/0285829 A1* | 9/2022 | Takenaka | ............. | H01Q 1/3233 |
| 2023/0031896 A1* | 2/2023 | Kim | ........................ | H01Q 21/28 |
| 2024/0243462 A1* | 7/2024 | Kim | ........................ | H01Q 1/32 |
| 2024/0421468 A1* | 12/2024 | Ahn | ........................ | H01Q 1/002 |
| 2025/0030155 A1* | 1/2025 | Sasaki | ................... | H01Q 1/405 |

* cited by examiner

1000

1000

400    200

HIDDEN ANTENNA MODULE

CROSS-REFERENCE TO RELATED APPLICATIONS

This application claims priority under 35 U.S.C. § 119 to Korean Patent Application No. 10-2023-0075630, filed on Jun. 13, 2023, in the Korean Intellectual Property Office, the disclosure of which is incorporated herein by reference in its entirety.

TECHNICAL FIELD

The following disclosure relates to an antenna module, and in particular, to a hidden antenna module provided on the roof of a vehicle.

BACKGROUND

Hidden antennas in vehicles refer to antennas that are hidden inside rather than exposed to the outside. These antennas are mainly used in place of roof antennas or external antennas of vehicles and are devices that may receive and transmit signals from and to wireless communication devices, such as radio sets, mobile phones, GPS, etc., while maintaining a clean exterior of vehicles.

A hidden antenna is usually built inside the window glass of a vehicle or may be hidden in the ceiling, floor, rear bumper, etc. of a vehicle body. When the antenna is not exposed to the outside like this, it may help maintain the exterior or design of the vehicle, and since an exposed portion of the antenna is reduced, damage from accidents, corrosion from weather, etc. may be prevented.

Specifically, referring to the case of a hidden antenna mounted on a rear roof of a vehicle shown in FIGS. 1 and 2, multiple antennas, such as 5G 4CH, HD-GNSS, SXM, and RKE 2CH may be mounted, but only a small number of remote key entry (RKE) circuits may be applied as system circuits.

In this case, if the number of system circuits in a corresponding antenna increases, system stability may deteriorate due to increased heat generation by chips. More specifically, since the system circuits are mounted on the roof of the vehicle, heat generation due to external solar heat may increase, which may degrade the reception performance of an antenna. In addition, since the corresponding antenna is mounted on the roof of the vehicle, there may be structural vulnerability in an antenna module due to the curvature of a vehicle body.

SUMMARY

An exemplary embodiment of the present invention is directed to providing a hidden antenna module capable of securing system stability although a combination of an antenna and a system circuit is mounted on a roof of a vehicle and improving structural vulnerability due to curvature of a vehicle body, by reducing heat generation and improving reception performance.

In one general aspect, a hidden antenna module includes: a housing including upper and lower covers; a first substrate provided inside the housing; second and third substrates provided inside the housing and respectively provided on both sides of the first substrate; upper and lower shield cans provided inside the housing and respectively provided on one side and the other side of at least one of the first to third substrates to support a portion of at least one of the first to third substrates; and a connection member connecting the first to third substrates to each other, wherein the first to third substrates are connected at different angles by the connection member.

The hidden antenna module may further include: a fixing member passing through and fixing at least one of the second and third substrates, the shield can, and the housing.

The connection member may be formed through solder and couples one side of each of the second and third substrates to the first substrate at a predetermined angle.

The fixing member may pass through and fix the second and third substrates, the upper shield can, and the upper cover.

The fixing member may pass through and fix the second and third substrates, the upper and lower shield cans, and the lower cover.

The fixing member may pass through and fix the upper shield can and the upper cover.

In another general aspect, a hidden antenna module includes: a first substrate; second and third substrates provided on both sides of the first substrate; a shield can provided on one side and the other side of the first to third substrates to support a portion of at least one of the first to third substrates; and a housing accommodating at least some of the first to third substrates and the shield can, wherein the housing is provided on both sides of the shield can and includes a structure partially interlaced with the shield can.

The housing may include a plastic structure, and the shield can include an aluminum alloy structure.

The first substrate may include first elements generating heat equal to or greater than a predetermined reference, the second and third substrates may include second elements having reception performance equal to or greater than a predetermined reference, a region of the first substrate in which one surface and the other surface are respectively surrounded by the housing and the shield can may include third elements different from the first and second elements, and the third elements may be provided at a predetermined distance or less from a modem provided in the first substrate.

Other features and aspects will be apparent from the following detailed description, the drawings, and the claims.

DETAILED DESCRIPTION

In order to describe the present invention, the operational advantages of the present invention, and the objects achieved by the practice of the present invention, exemplary embodiments of the present invention are described.

Terms used in the present application are used only to describe specific exemplary embodiments, and are not intended to limit the present invention. A singular form may include a plural form if there is no clearly opposite meaning in the context. It will be further understood that the terms "comprises" or "have" used in this specification, specify the presence of stated features, numerals, steps, operations, components, parts, or a combination thereof, but do not preclude the presence or addition of one or more other features, numerals, components, parts, or a combination thereof.

In describing the present invention, if it is determined that a detailed description of a related known configuration or function may obscure the gist of the present invention, the detailed description will be omitted.

Figure 1:
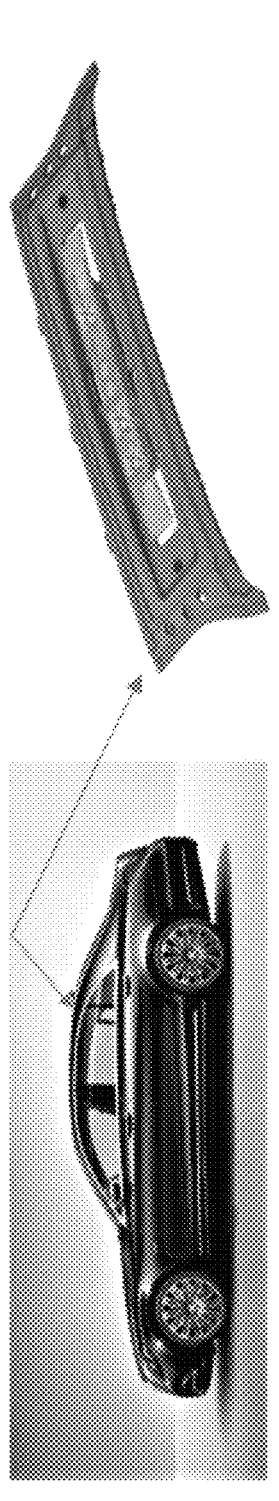
FIG. 1 is a diagram illustrating a hidden antenna module provided in a conventional vehicle.
Figure 1:
Figure 2:
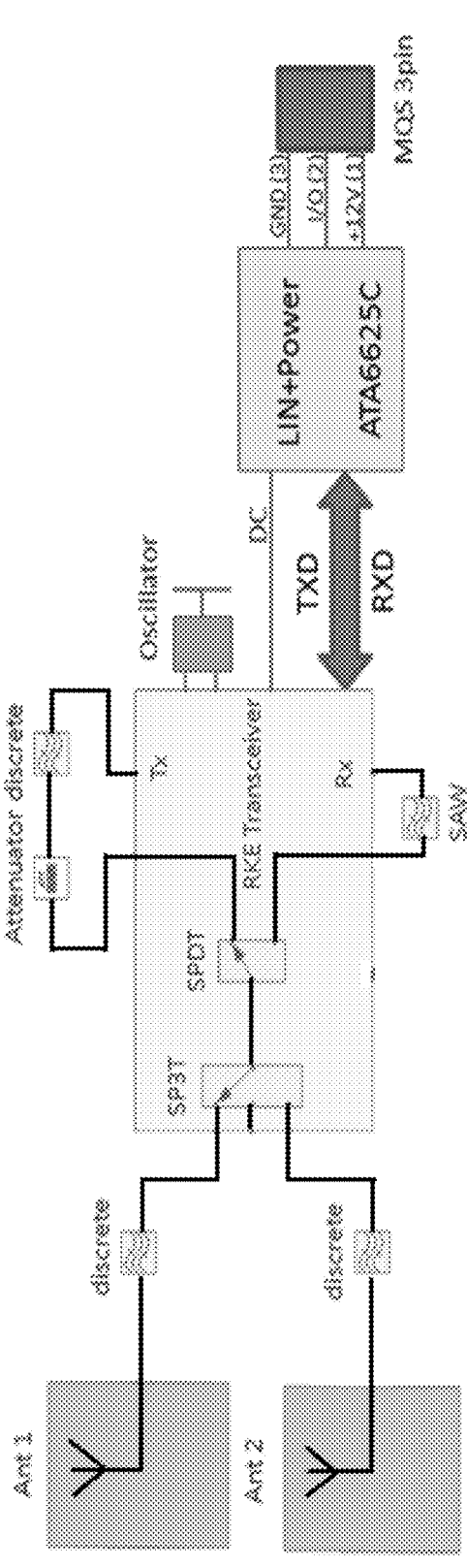
FIG. 2 is a diagram illustrating a remote key entry (RKE) circuit within a hidden antenna module.
Figure 3:
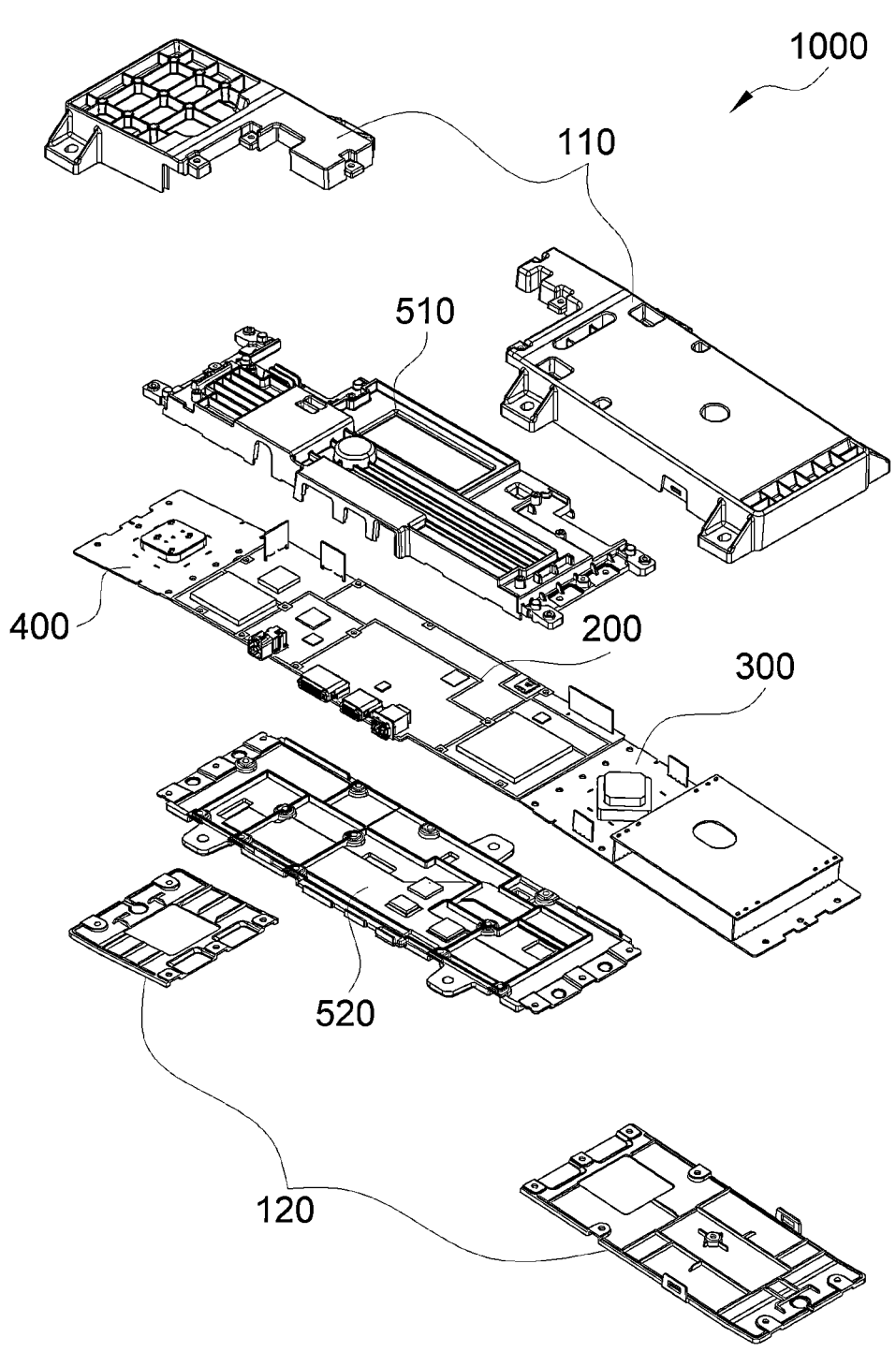
FIG. 3 is a perspective view illustrating a hidden antenna module according to the present invention.

FIG. 3 is a perspective view illustrating a hidden antenna module according to the present invention.

As shown in FIG. 3, a hidden antenna module 1000 according to the present invention may include a housing (not shown, but including 110, 120), first to third substrates 200, 300, and 400, a shield can (not shown, but including 510, 520), and a connection member 600.

The housing 100 is a device that accommodates at least one of the shield can 500 or the first to third substrates 200, 300, and 400 of the present invention, and may include an upper cover 110 and a lower cover 120.

The first substrate 200 may be provided (or disposed) inside the housing 100.

The second substrate 300 and the third substrate 400 may also be provided inside the housing 100 and may be provided on both sides of the first substrate 200, respectively.

The shield can (not shown, but including 510, 520) may include an upper shield can 510 and a lower shield can 520 and may be provided inside the housing 100 to have at least one of the first to third substrates 200, 300, and 400 on each of one surface or the other surface to support a portion of at least one of the first to third substrates 200, 300, and 400.

The connection member 600 may connect the first to third substrates 200, 300, and 400 to each other.

At this time, the first to third substrates 200, 300, and 400 may be connected to each other at different angles by the connection member 600.

Figure 4:
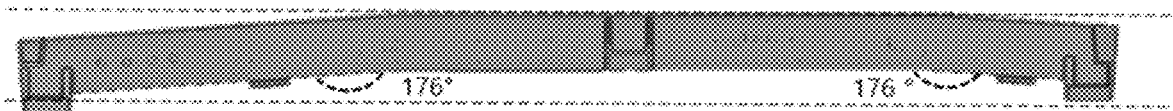
FIG. 4 is a schematic diagram illustrating an angle between substrates according to the present invention.
Figure 5:
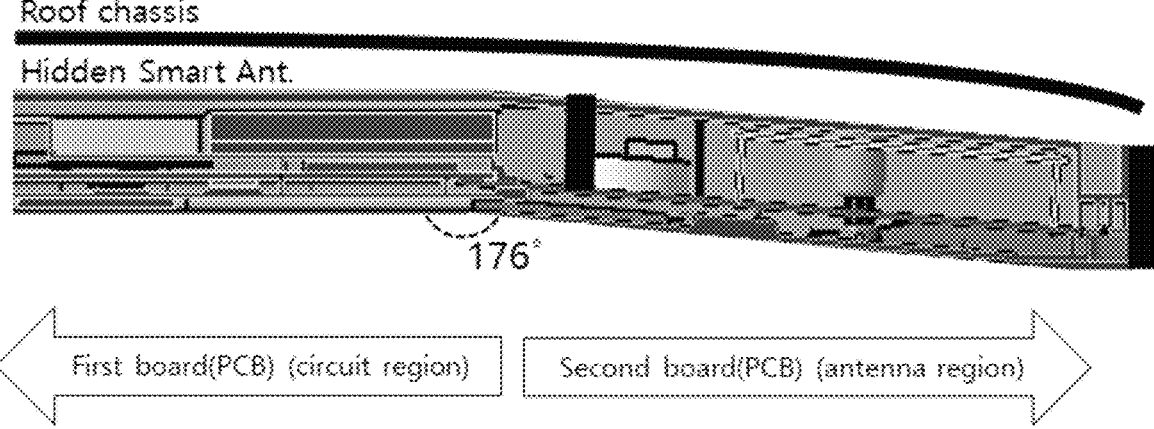
FIG. 5 is an enlarged view of FIG. 4.

Specifically, as shown in FIGS. 4 and 5, an angle between the first substrate 200 and the second substrate 300 and between the first substrate 200 and the third substrate 400 may be about 176 degrees. This is a structure that corresponds to the curvature of a vehicle roof, and the angle is not limited thereto and may vary depending on various vehicle types. In addition, by applying this structure, there is an effect of improving the vulnerability of a structure due to the curvature of the vehicle body.

Figure 6A:
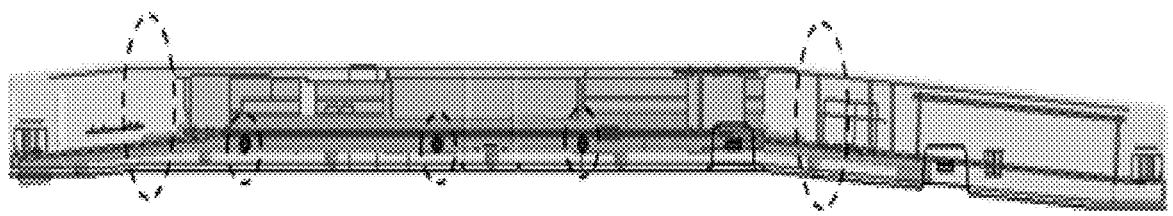
FIGS. 6A and 6B show views of a conventional antenna module.
Figure 6B:
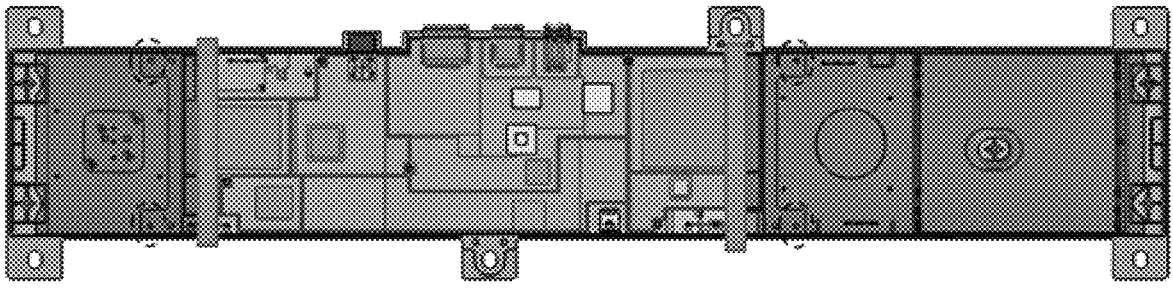

FIGS. 6A and 6B are perspective views illustrating a conventional antenna module.

As shown in FIG. 6A, in the conventional antenna module, there is a section that is vulnerable to external force. Specifically, it may be a portion of both sides of the antenna module, which is a section that is bent according to a curvature design of the vehicle due to the nature of being provided in the vehicle, and in addition, rigidity may be vulnerable because a plastic material is applied to ensure the reception performance of the antenna.

In addition, as shown in FIG. 6B, since a fixing structure is located on the side of a die casting, an antenna region is vulnerable to external force.

Accordingly, to solve the problems described above, various exemplary embodiments are applied to the hidden antenna module 1000 according to the present invention.

First, according to the present invention, the plurality of substrates 200, 300, and 400 are connected through solder using lead (Pb), and in order to prevent stress from being applied to the lead at the connection region due to vibration and shock, the periphery of the lead connection region may be fixed with screws, thereby preventing cracks. In addition, shaking may be prevented by applying additional fixing points close to the lead position.

Figure 7:
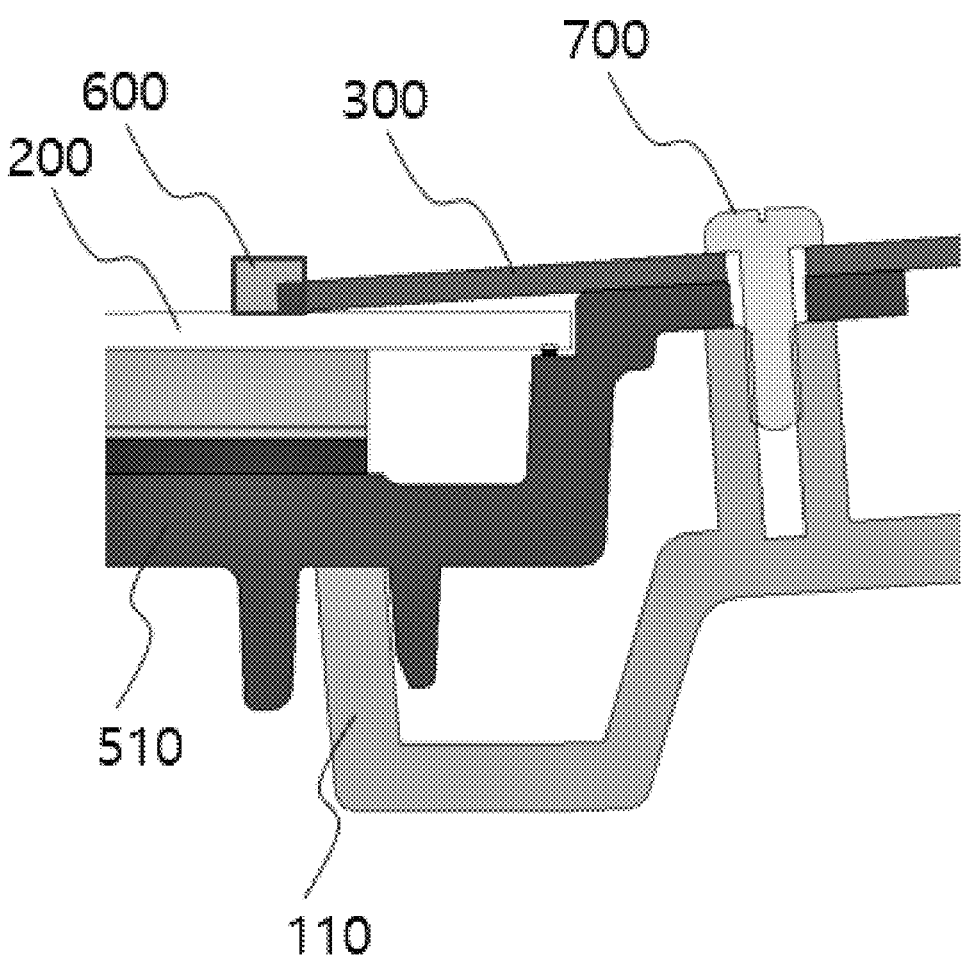
FIG. 7 is a side schematic diagram of a hidden antenna module according to the present invention.
Figure 8:
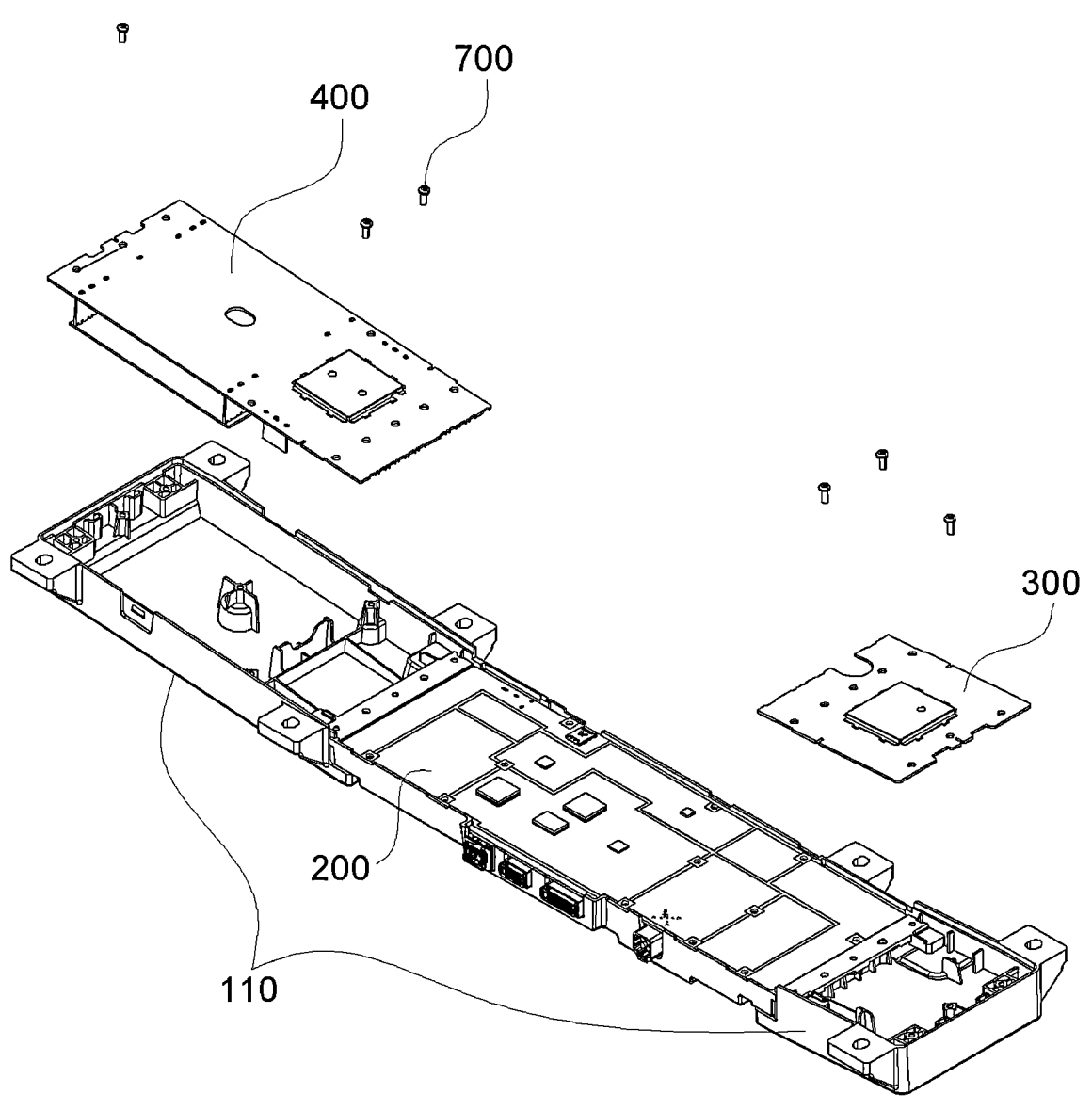
FIG. 8 is a perspective view illustrating a substrate fixing method according to the present invention.
Figure 9:
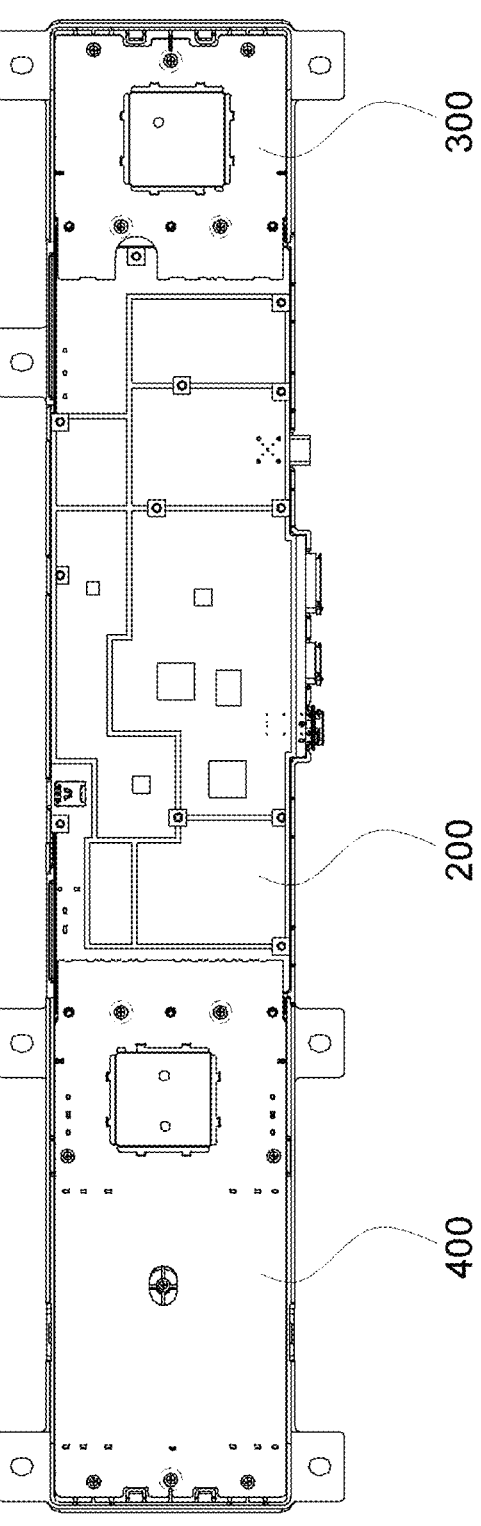
FIG. 9 is a front view of a hidden antenna module after the process of FIG. 8 is performed.

FIG. 7 is a side schematic diagram of the hidden antenna module according to the present invention, FIG. 8 is a perspective view illustrating a substrate fixing method according to the present invention, and FIG. 9 is a front view of the hidden antenna module after the process of FIG. 8 is performed.

As shown in FIG. 7, the hidden antenna module 1000 according to the present invention may further include a fixing member 700 to fix the plurality of substrates 200, 300, and 400 to each other.

Specifically, the structure described below is designed to minimize stress on the lead (Pb) connection region and may prevent vibration and shock.

As shown in FIG. 7, the fixing member 700 may extend or pass through and fix at least one of the second and third substrates 300 and 400, the shield can 500, and the housing 100.

Specifically, as shown in FIG. 7, a portion of the upper shield can 510 may be assembled and provided on the upper cover 110.

In addition, the first substrate 200 may be assembled to the upper shield can 510, and the second substrate 300 and the third substrate 400 may be provided on at least one of the first substrate 200, the upper shield can 510, and the upper cover 110.

At this time, the fixing member 700 may extend through and fix the second and third substrates 300 and 400, the upper shield can 500, and the upper cover 110 that are stacked and assembled.

As a result, it is possible to form a fixing point before performing a subsequent soldering process.

Thereafter, one side of each of the second and third substrates 300 and 400 and the first substrate 200 may be coupled to each other using the connection member 600.

At this time, the connection member 600 is a member formed through lead solder, through which the second and third substrates 300 and 400 and the first substrate 200 may be coupled to each other at a predetermined angle.

Referring to FIGS. 8 and 9, the first substrate 200 may be assembled to the upper shield can 510, the second substrate 300 and the third substrate 400 may be assembled to the upper cover 110 assembled to both sides of the upper shield can 510.

Thereafter, the fixing member 700 may be fastened to fix the first substrate 200 and the second substrate 300, and similarly, the fixing member 700 may be fastened to fix the first substrate 200 and the third substrate 400.

In addition, lead soldering may be performed on a surface of the second substrate 300 and the third substrate 400 that faces the first substrate 200, together with the first substrate 200.

Meanwhile, a hole may be formed in a portion to be fastened to the fixing member 700, and the fixing member 700 may be inserted into this hole and fixed to each other.

Figure 10:
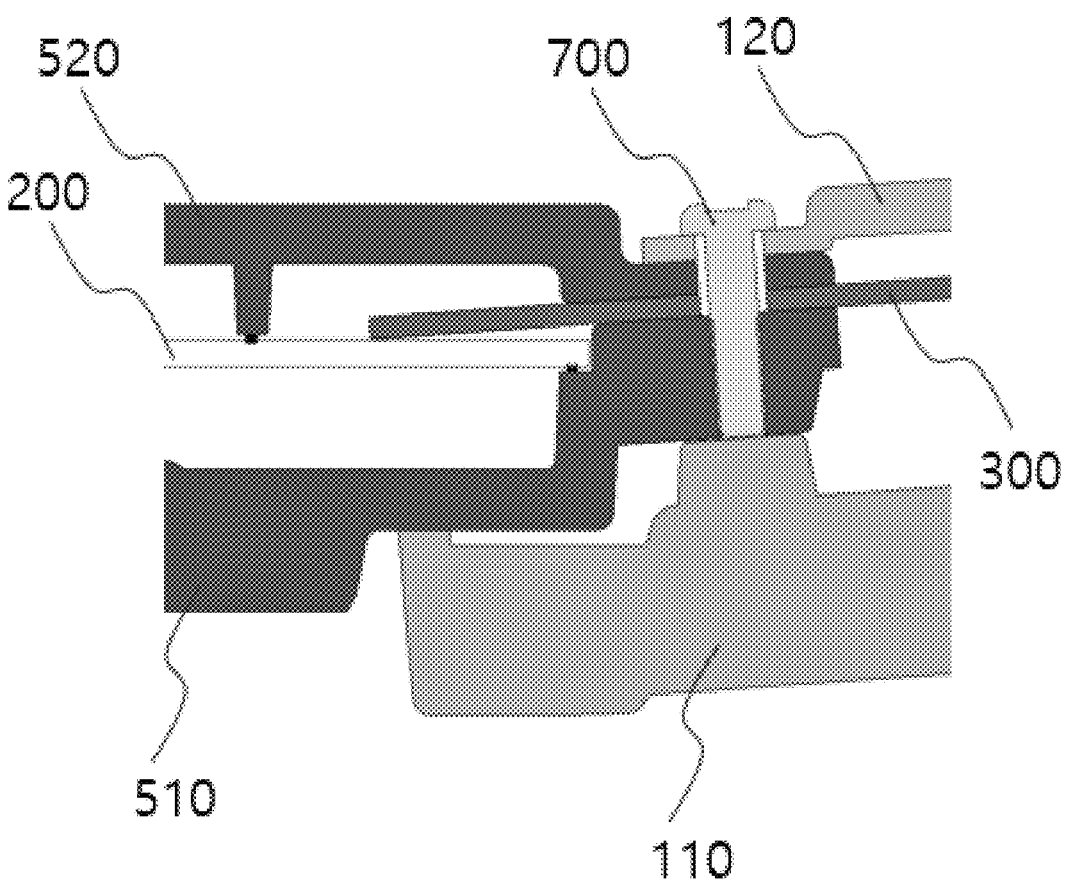
FIG. 10 is a side schematic diagram of a hidden antenna module according to the present invention.
Figure 11:
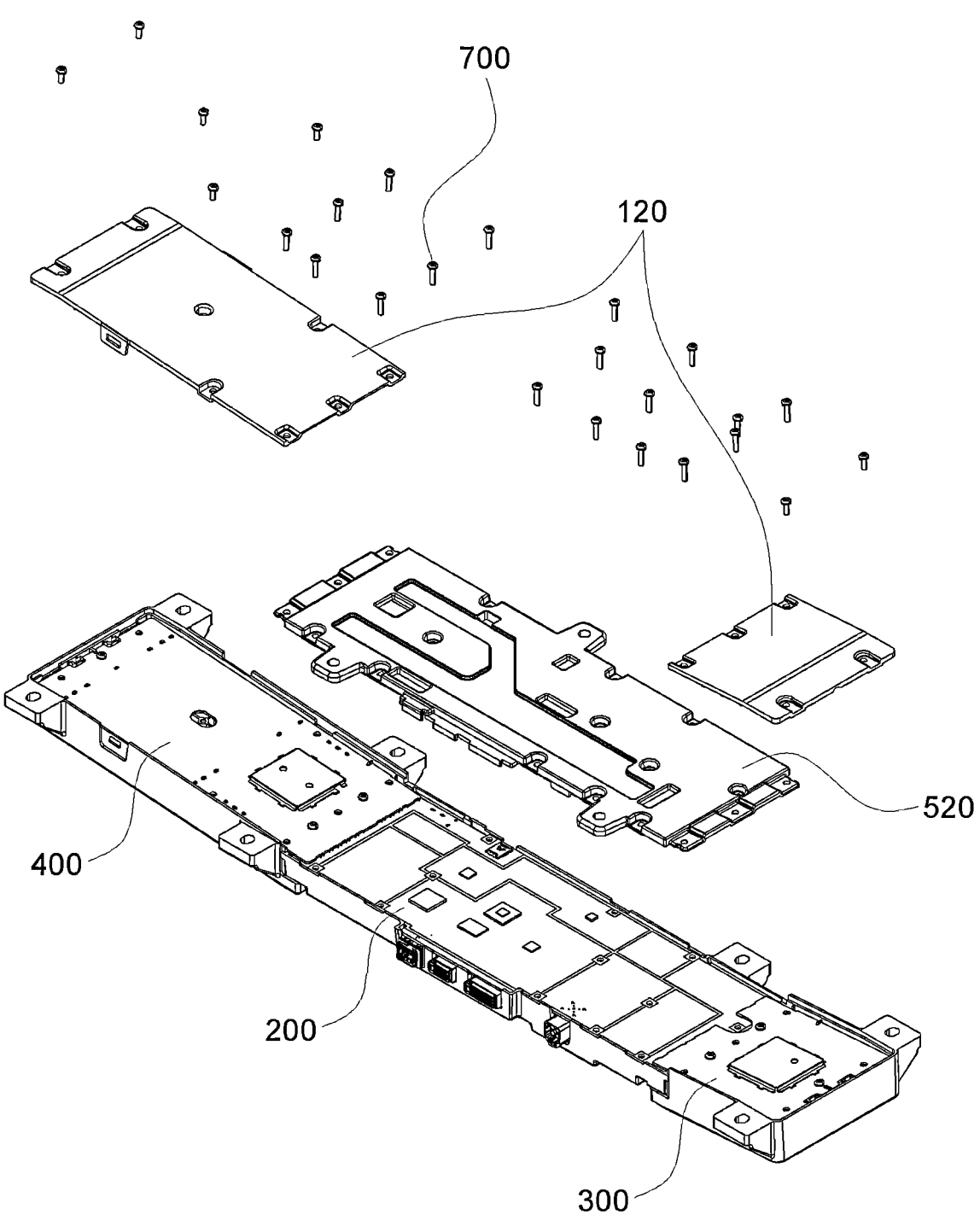
FIG. 11 is a perspective view illustrating a method of fixing a lower shield can and a lower cover according to the present invention.
Figure 12:
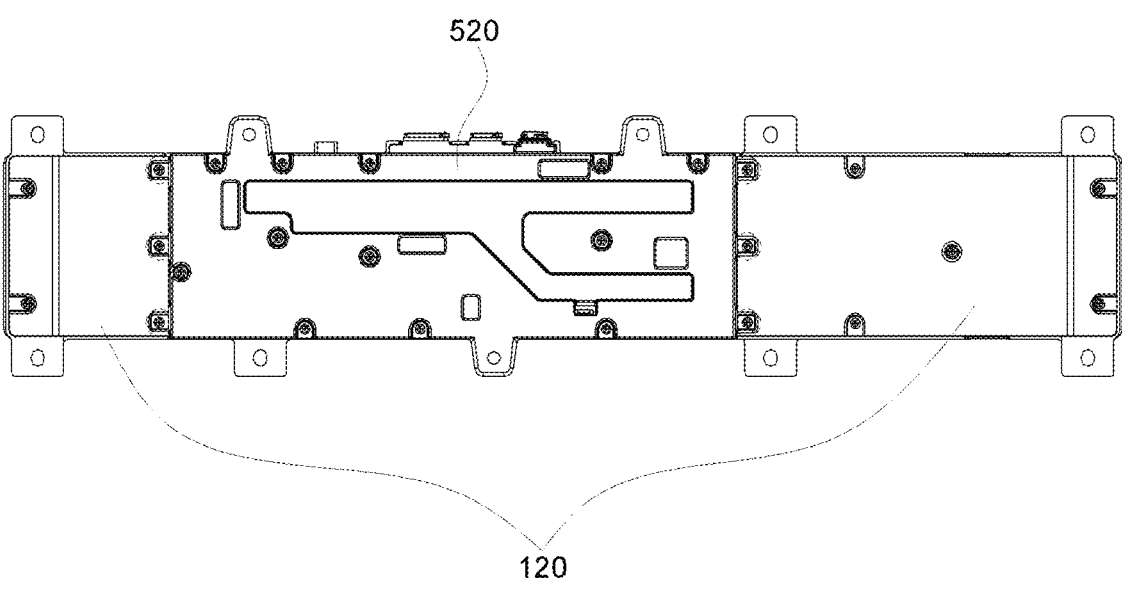
FIG. 12 is a front view of a hidden antenna module after the process of FIG. 11 is performed.

FIG. 10 is a side schematic diagram of the hidden antenna module according to the present invention, FIG. 11 is a perspective view illustrating a method of fixing the lower shield can and the lower cover according to the present invention, and FIG. 12 is a front view of the hidden antenna module after the process of FIG. 11 is performed.

As shown in FIG. 10, the fixing member 700 may extend through and fix the second substrate 300, the upper shield can 510, the lower shield can 520, and the lower cover 120, and may also extend through hand fix the third substrate 400, the upper shield can 510, the lower shield can 520, and the lower cover 120.

Specifically, referring to FIGS. 11 and 12, in a state in which the first to third substrates 200, 300, and 400 are assembled, the lower shield can 500 and the lower cover 120 may be additionally assembled through the fixing member 700, thereby supporting the first to third substrates 200, 300, and 400.

Accordingly, there is an effect of reinforcing rigidity and preventing cracking of lead due to vibration and impact.

Next, a cross-open structure for preventing horizontal bending will be described.

Figure 13:
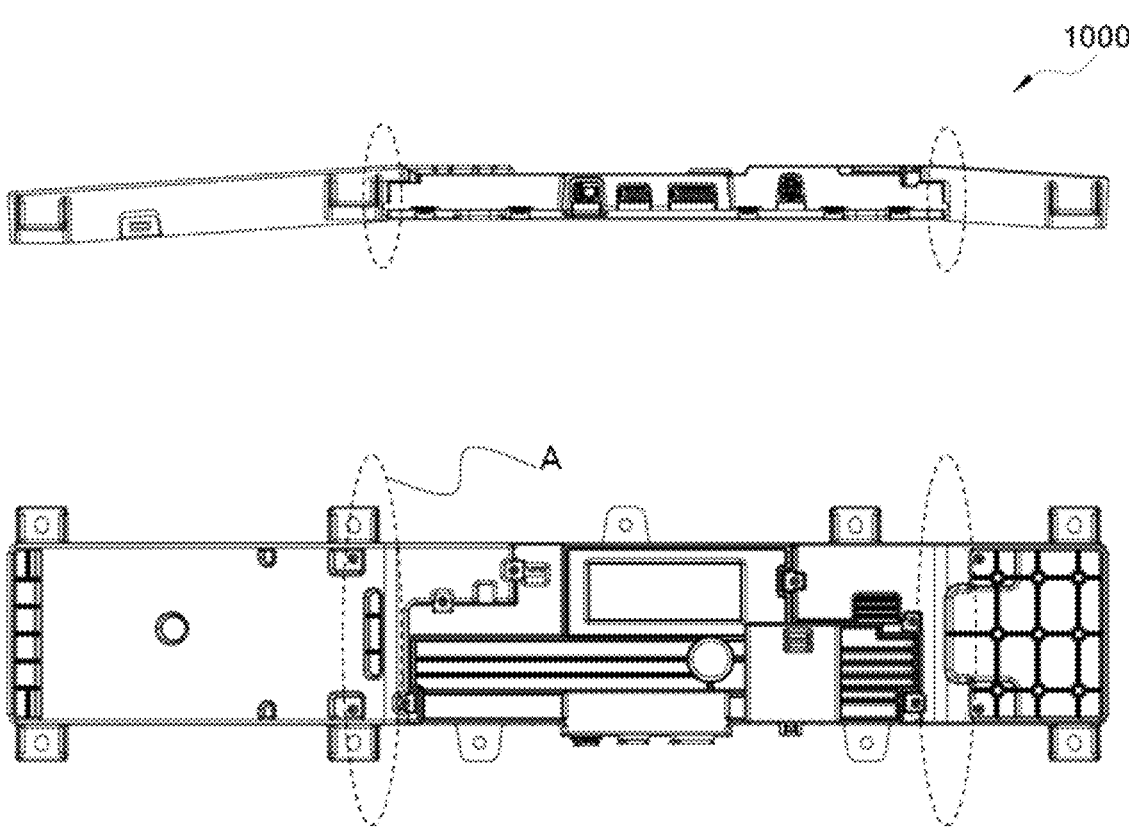
FIG. 13 is a diagram illustrating a force generating zone when external force is generated.
Figure 14A:
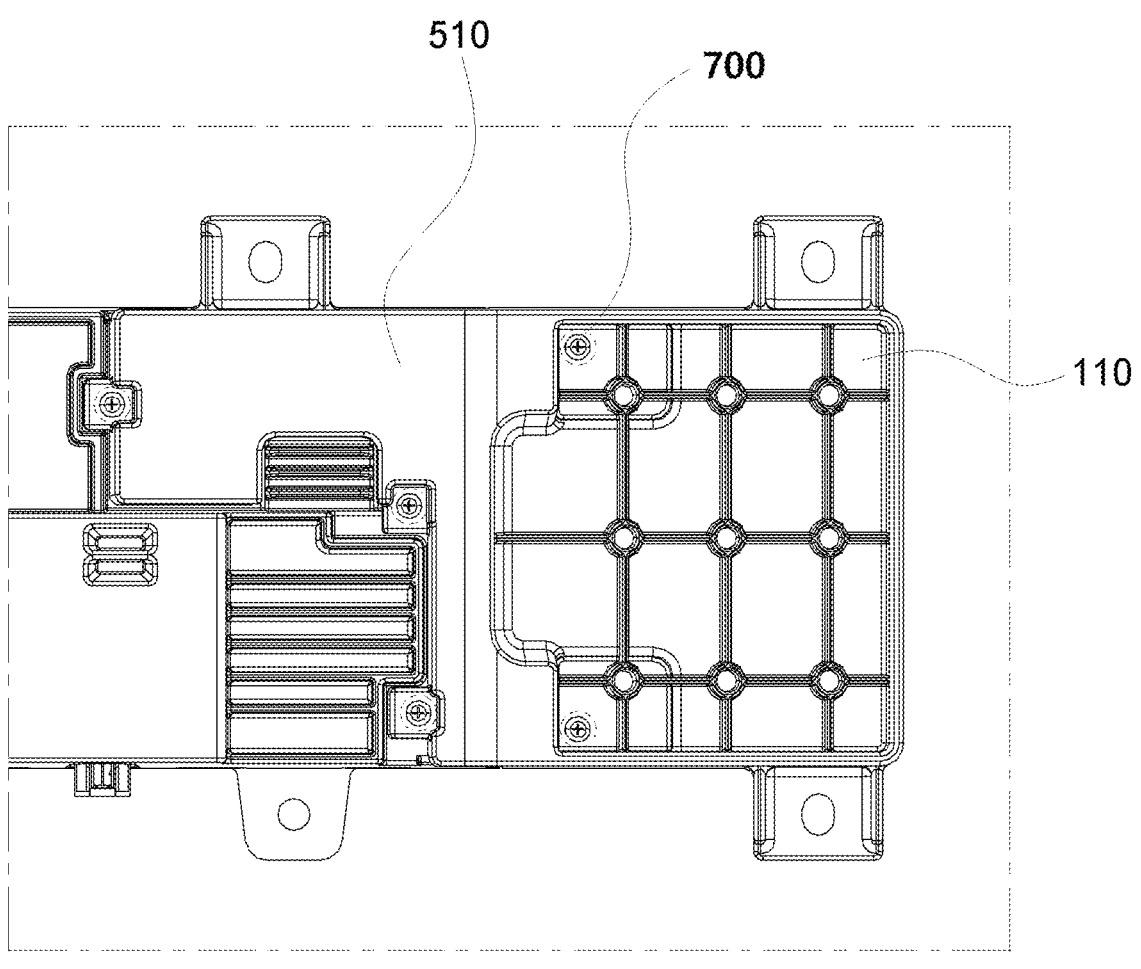
FIGS. 14A, 14B and 14C show various views of a screw fastening position when a hidden antenna module of the present invention is viewed from one side and the other side.
Figure 14B:
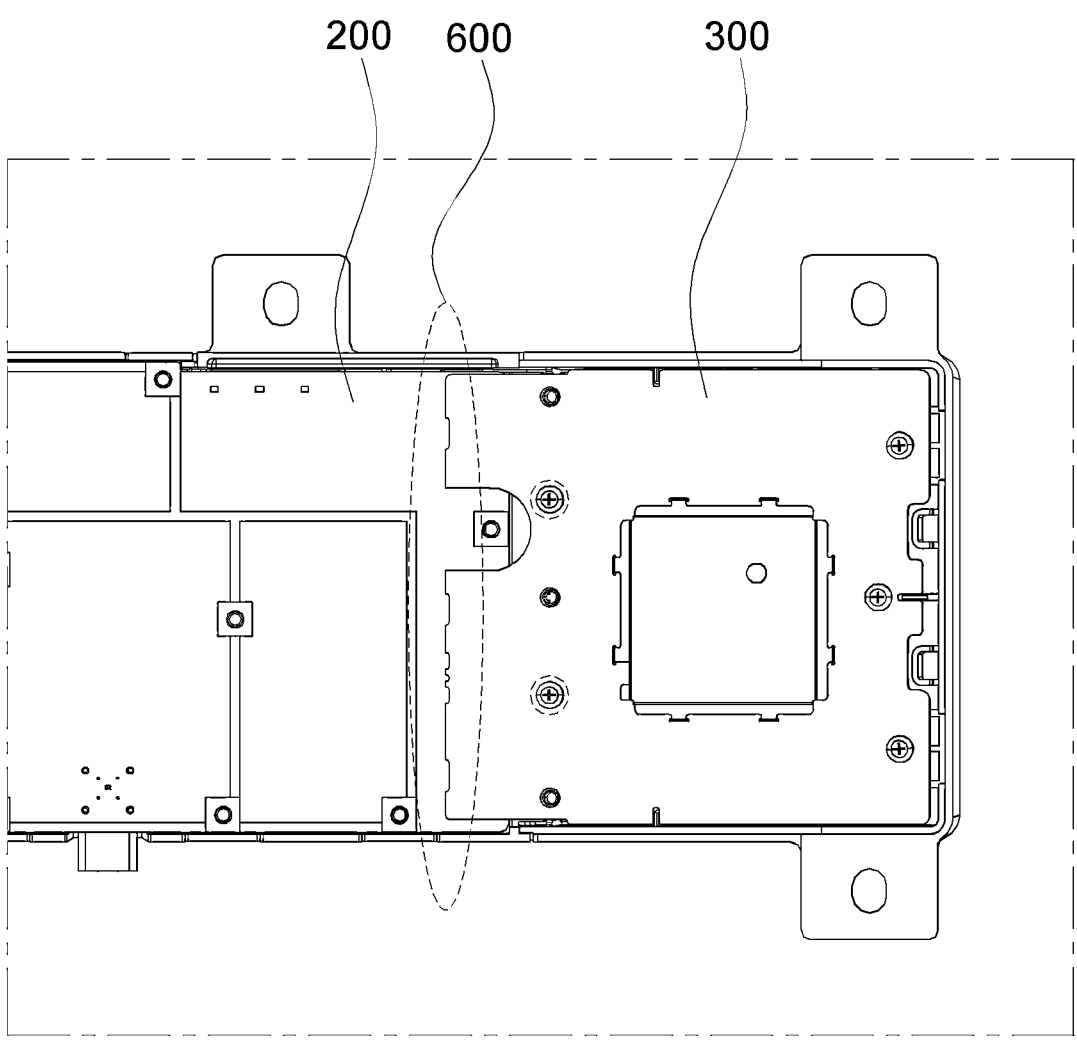
Figure 14C:
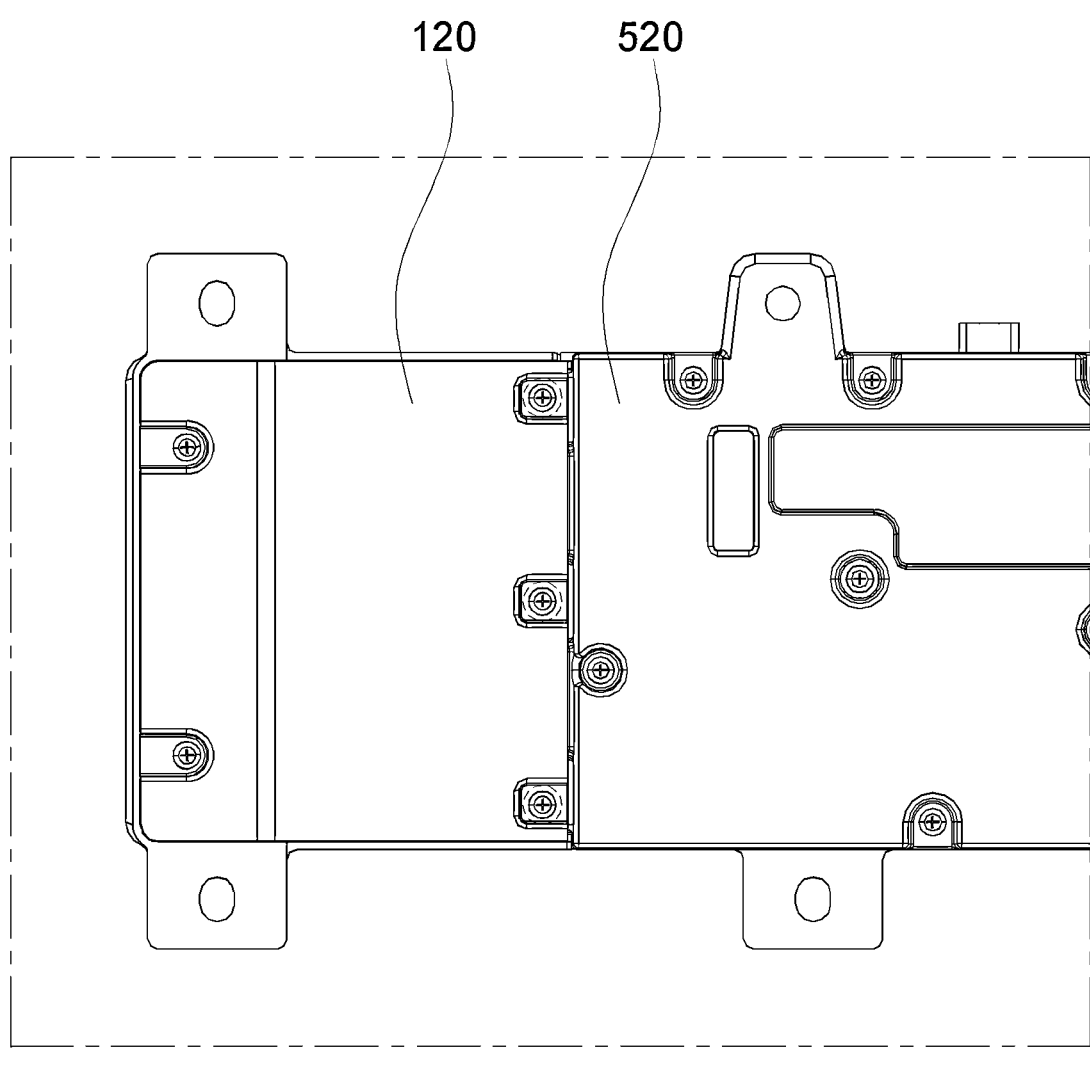
Figure 15A:
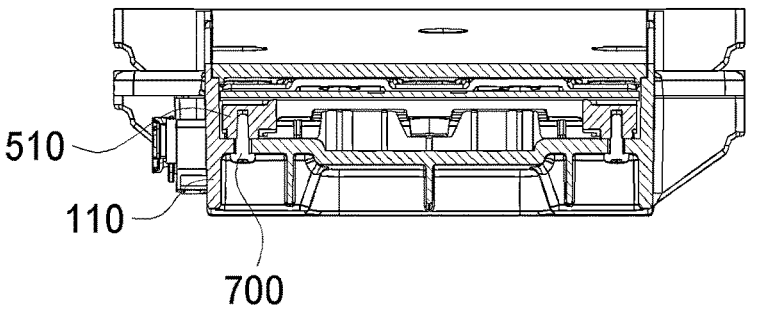
FIGS. 15A and 15B show cross-sectional views of some of the views of FIGS. 14A, 14B and 14C.
Figure 15B:
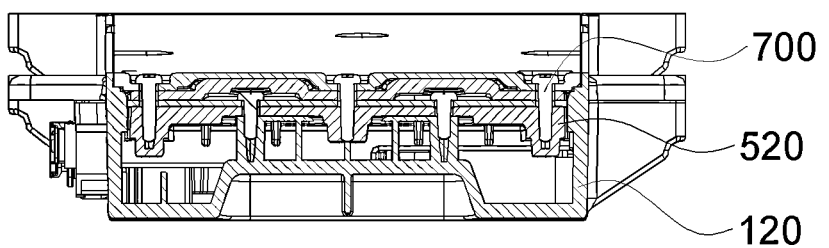

FIG. 13 is a diagram illustrating a force generating region when external force is generated, FIGS. 14A, 14B and 14C are diagrams illustrating a screw fastening position when the hidden antenna module of the present invention is viewed from one side and the other side, and FIGS. 15A and 15B are schematic diagrams illustrating each cross-sectional views of the views shown in FIGS. 14A, 14B and 14C.

As shown in FIG. 13, when external force occurs, bending may occur in region A.

To prevent such horizontal bending, the hidden antenna module 1000 according to the present invention may include a cross-open structure as shown in FIG. 13.

FIG. 14A shows an upper portion of the hidden antenna module 1000, which may be integrated by as the fixing member 700 extends through and fix the upper shield can 510 and the upper cover 110.

In other words, the upper cover 110 may be integrated by fixing the upper cover 110 to the upper shield can 510 with a screw.

Since the shield can 500 is the hardest, the shield can 500 may be placed at the base (center) position of the hidden antenna module 1000 of the present invention, and the upper cover 110, which is relatively weaker than the upper shield can 510, may be reinforced by screw fastening.

In addition, FIG. 14C shows a lower portion of the hidden antenna module 1000. As described above with reference to FIGS. 9 and 12, the first to third substrates 200, 300, and 400 may be fixed to the integrated upper shield can 510 and the upper cover 110 generated by FIG. 14A through the fixing member 700, lead soldering may be performed.

Thereafter, as shown in of FIG. 14C, the lower shield can 520 and the lower cover 120 may be fixed through the fixing member 700.

This structure may strongly withstand force generated from external force by cross-fastening the fixing member 700 at a position receiving power due to external force.

Referring to FIGS. 15A and 15B, it can be seen that a total of seven fixing members 700 are cross-fastened to the upper and lower shield cans 510 and 520 of the hidden antenna module 1000 of the present invention.

This structure may prevent the hidden antenna module 1000 from bending and may strongly withstand power generated from external force.

Figure 16:
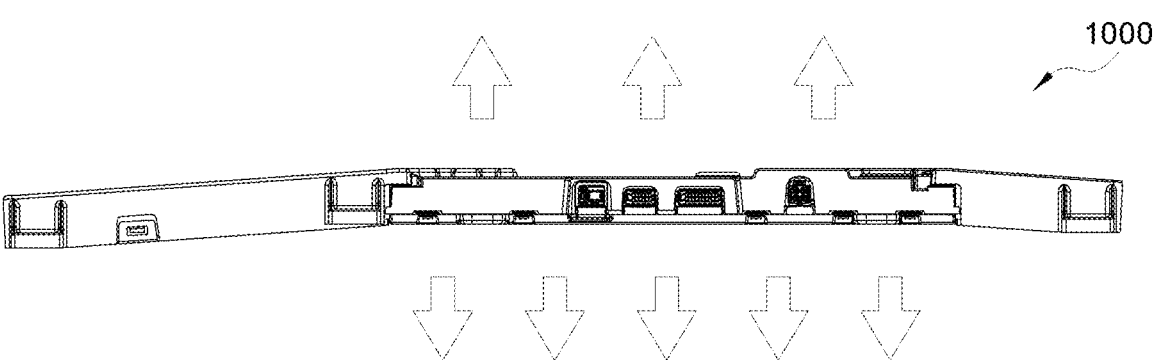
FIG. 16 is a diagram illustrating region separation according to a function of a hidden antenna module according to the present invention.
Figure 17:
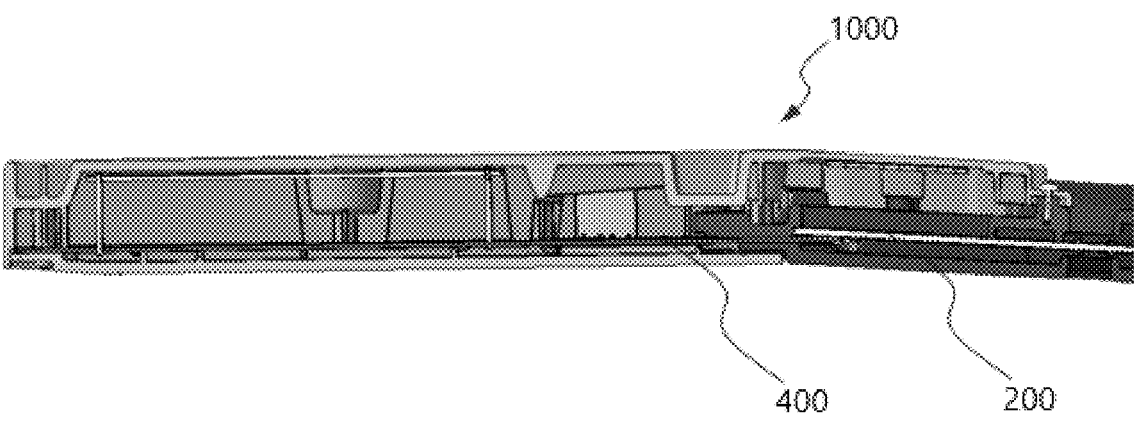
FIG. 17 is a diagram illustrating a substrate pressing structure according to FIG. 16.

FIG. 16 is a diagram illustrating region separation according to a function of the hidden antenna module according to the present invention;

FIG. 17 is a diagram illustrating a substrate pressing structure according to FIG. 16.

As shown in FIG. 16, the hidden antenna module 1000 according to another exemplary embodiment of the present invention may include the first to third substrates 200, 300, and 400, the shield can 500, and the housing 100.

The first to third substrates 200, 300, and 400 may be PCB boards, and the second substrate 300 and the third substrate 400 may be provided on both sides of the first substrate 200.

The shield can 500 may include the upper shield can 510 and the lower shield can 520 and may be provided inside the housing 100 to have at least one of the first to third substrates 200, 300, and 400 on each of one surface or the other surface to support a portion of at least one of the first to third substrates 200, 300, and 400.

The housing 100 is a device that accommodates at least one of the shield can 500 or the first to third substrates 200, 300, and 400 of the present invention and may include the upper cover 110 and the lower cover 120.

At this time, the housing 100 may be provided on both sides of the shield can 500 and may include a cross structure interlaced with a portion of the upper shield can 510 at a point where the housing 100 and the shield can 500 contact.

Specifically, the housing 100 may include a plastic structure, and the shield can 500 may include an aluminum alloy structure.

Therefore, by providing the upper cover 110 and the upper shield can 510 in a cross structure, the aluminum alloy structure of the shield can 500 reinforces the weak rigidity due to the plastic structure of the housing 100, thereby ensuring rigidity and reducing weight.

In addition, the first substrate 200 may include first elements that generate heat equal to or higher than a predetermined amount, quantity or reference, and the first elements may be heat-generating elements.

The second and third substrates 300 and 400 may include second elements having reception performance equal to or above a predetermined amount, quantity or reference, and the second elements may be antenna elements.

Here, due to the cross-structure of the upper cover 110 and the upper shield can 510, there may be a region in which on one side and the other side are surrounded by the upper cover 110 and the lower shield can 520, respectively, in the first substrate 200.

This region may include third elements that are different from the first and second elements, and the third elements may be elements that should secure reception performance and heat dissipation performance at the same time.

Specifically, the third elements may be elements whose distance from a modem provided on the first substrate 200 should be maintained below a predetermined distance to ensure reception performance.

Therefore, the central portion of the shield can 500 exposed to the outside may minimize the influence of the antenna and form a heat dissipation region at the same time as shown in FIG. 16 and the housing 100 provided on both sides of the shield can 500 may form an antenna region in which reception performance is secured.

In addition, as shown in FIG. 17, by applying the pressing structure of the substrate, the rigidity of the shield can 500 may form a vertical support structure to reduce deformation vulnerability due to the material characteristics of the second substrate (not shown), the third substrate 400, and the first substrate 200.

In addition, the first to third substrates 200, 300, and 400 have the same behavior as that of the shield can 500, thereby minimizing the risk of lead cracking.

The hidden antenna module according to various exemplary embodiments of the present invention as described above has an effect of increasing system circuits by effectively reducing heat generated from the chip.

In addition, by improving the structural vulnerability due to the curvature of the vehicle body, damage due to external force in the portion connecting the substrates may be prevented.

Although the preferred exemplary embodiments of the present invention have been described above, the exemplary embodiments disclosed in the present invention are not intended to limit the technical spirit of the present invention, but are only for explanation. Therefore, the technical spirit of the present invention includes not only each disclosed exemplary embodiment, but also a combination of the disclosed exemplary embodiments, and furthermore, the scope of the technical spirit of the present invention is not limited by these exemplary embodiments. In addition, those skilled in the art to which the present invention pertains may make many changes and modifications to the present invention without departing from the spirit and scope of the appended claims, and all such appropriate changes and modifications, as equivalents, are to be regarded as falling within the scope of the present invention.

What is claimed is:

1. A hidden antenna module comprising:

a housing including upper and lower covers;

a plurality of substrates at least partially disposed at a space between the upper and lower covers of the housing, the plurality of substrates comprising:

a first substrate having first and second sides; lateral side portions located mutually opposite to each other;

a second substrate disposed on a first lateral side of the first substrate and connected to the first lateral side portion of the first substrate; and a third substrate disposed on a second lateral side of the first substrate opposite to the first lateral side and connected to the second lateral side portion of the first substrate, wherein each of the first, second and third substrates has upper and lower surfaces respectively facing in upward and downward directions;

a plurality of shield cans at least partially disposed at the space between the upper and lower covers of the housing and configured to support a portion of at least one of the first, second and third substrates, the plurality of shield cans including upper and lower shield cans disposed respectively on the upper and lower surfaces of at least one of the first, second and third substrates;

a connection member configured to respectively connect the second and third substrates to the first and second lateral side portions of the first substrate; and a fixing member spaced apart from the first substrate, extending through (1) either or both of the second and third substrates and (2) either or both of the upper and lower shield cans, and connected to the housing.

2. The hidden antenna module of claim 1, wherein the connection member comprises solder and is configured to couple a lateral side portion of each of the second and third substrates to the first substrate at a same predetermined angle.

3. The hidden antenna module of claim 1, wherein the fixing member extends through the second and third substrates and the upper shield can, and connected to the upper cover of the housing.

4. The hidden antenna module of claim 1, wherein the fixing member extends through the second and third substrates and the upper and lower shield cans, and connected to the lower cover of the housing.

5. The hidden antenna module of claim 1, wherein the fixing member extends through the upper shield can and connected to the upper cover of the housing.

6. A hidden antenna module comprising:

a first substrate having first and second lateral side portions located mutually opposite to each other;

a second substrate disposed on a first lateral side of the first substrate and connected to the first lateral side portion of the first substrate;

a third substrate disposed on a second lateral side of the first substrate opposite to the first lateral side and connected to the second lateral side portion of the first substrate, wherein each of the first, second and third substrates has upper and lower surfaces respectively facing in upward and downward directions;

a shield can at least partially disposed on at least one of the upper and lower surfaces of at least one of the first, second and third substrates and configured to support a portion of at least one of the first, second and third substrates; and a housing configured to house at least one of the first, second and third substrates and the shield can, wherein the housing comprises first and second covers respectively provided on mutually opposite lateral sides of the shield can, each of the first and second covers including a structure partially interlaced with a different one of mutually opposite lateral side portions of the shield can.

7. The hidden antenna module of claim 6, wherein the housing includes plastic, and the shield can include an aluminum alloy.

8. The hidden antenna module of claim 6, wherein:

the first substrate includes a plurality of first elements configured to generate at least a predetermined amount of heat, the second and third substrates include a plurality of second elements exhibiting at least a predetermined amount of reception performance, and a region of the first substrate in which the first and second surfaces of the first substrate are respectively adjoined by the housing and the shield can includes a plurality of third elements disposed away from a modem disposed at the first substrate.

* * * * *